United States Patent [19]

Puhn

[11] Patent Number: 4,994,633
[45] Date of Patent: Feb. 19, 1991

[54] BEND-TOLERANT SUPERCONDUCTOR CABLE

[75] Inventor: Frederick A. Puhn, National City, Calif.

[73] Assignee: General Atomics, San Diego, Calif.

[21] Appl. No.: 289,226

[22] Filed: Dec. 22, 1988

[51] Int. Cl.$^5$ ............................................. H01B 12/00
[52] U.S. Cl. .................................. 174/125.1; 29/599; 174/15.5; 335/216; 505/886; 505/887
[58] Field of Search ........................... 174/15.5, 125.1; 29/599; 335/216; 505/886, 887

[56] References Cited

U.S. PATENT DOCUMENTS

| | | | |
|---|---|---|---|
| 3,458,842 | 7/1969 | Zar | 174/125.1 X |
| 4,079,187 | 3/1978 | Fillunger et al. | 174/15.5 |
| 4,327,244 | 4/1982 | Horvath et al. | 174/15.5 |
| 4,329,539 | 5/1982 | Tanaka et al. | 174/125.1 |
| 4,333,228 | 6/1982 | Koch | 29/599 |
| 4,421,946 | 12/1983 | Furuto et al. | 174/125.1 |
| 4,454,380 | 6/1984 | Turowski | 174/125.1 |
| 4,490,578 | 12/1984 | Suzuki et al. | 174/15.5 |
| 4,503,602 | 3/1985 | Hillmann | 29/599 |
| 4,554,407 | 11/1985 | Cesesara et al. | 174/125.1 |
| 4,652,697 | 3/1987 | Ando et al. | 174/125.1 |
| 4,673,774 | 6/1987 | Wake et al. | 174/94 R |
| 4,808,488 | 2/1989 | Chevrel et al. | 174/125.1 X |

FOREIGN PATENT DOCUMENTS

| | | | |
|---|---|---|---|
| 2440172 | 1/1976 | Fed. Rep. of Germany | 29/599 |
| 2602729 | 6/1977 | Fed. Rep. of Germany | 174/15.5 |
| 3506719 | 8/1985 | Fed. Rep. of Germany | 174/15.5 |
| 26673 | 3/1981 | Japan | 29/599 |
| 141107 | 11/1981 | Japan | 174/125.1 |

Primary Examiner—Morris H. Nimmo
Attorney, Agent, or Firm—Nydegger & Harshman

[57] ABSTRACT

An electric cable for shielding the conductor therein from tensile stresses during bending of the conductor in a predetermined lateral direction. An elongated duct having a pair of opposed sidewalls and a floor therebetween holds the conductive element, while an elongated lid of relatively substantial thickness is mounted in the opening to the duct between the free ends of the sidewalls. The lid fills the duct from the opening between the free ends of the sidewalls to the neutral surface produced by lateral bending of the cable in the direction of the floor of the duct. Bonding material secures the lid and duct in a fixed longitudinal relationship, and a suitable flowable filler encases the conductor in the resulting tubular housing. The cable disclosed has particular application to the preservation of the integrity of superconductor materials used as the conductor in the cable. Preferably, the duct and lid are made of soft and hard copper, respectively.

29 Claims, 3 Drawing Sheets

| STEP A | STEP B | STEP C | STEP D | STEP E | STEP F |

BEND-TOLERANT SUPERCONDUCTOR CABLE

BACKGROUND OF THE INVENTION

1. Field of the Invention

This invention relates to electrical conductors and to methods for fabricating electrical conductors which tolerate bending without jeopardizing the physical integrity of the conductive elements therein. More particularly, the present invention relates to the manufacture of superconducting cables capable of being bent to a limited degree to fabricate electrical devices, such as coils for generating electromagnetic fields.

2. Background Art

The recent development of electrically conductive materials which will transfer electricity with previously unknown low amounts of resistance at relatively high operating temperature offers great potential in many electrical areas. Such so-called superconductor materials are capable of passing large currents without generating excessive amounts of heat. Thus, by using superconductor materials, it will be possible to produce intense electromagnetic fields in an efficient and economical manner. To do so requires that coils be designed that incorporate the new superconductor technology.

The material properties of a superconductor present some obstacles. Known high temperature superconductor materials are, generally speaking, brittle ceramic substances which lack the ductility associated with most other metallic conductors and, accordingly, do not have any appreciable tensile strength or flexibility. It happens also that some low temperature superconductors, e.g. niobium tin ($Nb_3Sn$), also have these limitations.

The brittleness of known superconductor materials can cause difficulties when the conductors are manipulated. This is so because ceramic materials generally tolerate compressive stresses more readily than tensile stresses. The problem has some unique considerations when the superconductor is deposited on a metallic wire substrate. More particularly, the problem arises from the different stresses which are placed on the superconductor whenever the wire is bent.

In order to avoid excessive tensile stresses when twisting superconductor filaments together to produce filament bundles, extreme care must be taken to not cause sharp bends along the length of each filament. Bending produces compressive stresses on the side of the filament adjacent to the bend which can usually be tolerated without impairing the structural integrity of the superconductor layer. On the other hand, tensile stresses are produced in the ceramic material on the side of the bend opposite from the direction of bending which produce cracks and detract from the conductivity of the superconductor.

While the twisting of superconductor filaments required to produce a superconductor filament bundle can be relatively gradual, the problem of bending in superconductor materials becomes particularly severe when such bundles are to be installed in electrical machinery. There, the severity of bending is frequently dictated by the size and design of the equipment into which the superconductor material is to be incorporated. It is a challenge to handle, install and operate with superconductor materials while preserving their fragile structure.

For example, in the manufacture of electrical coils for producing high-intensity electromagnetic fields, bundles of superconductor filaments must be wound repeatedly in circular courses about rotors, about stators and within magnetic chambers. Generally, the repeated bending of wires in such coils is in the same lateral direction throughout much of the length of the wire or filament bundle. Thus, superconductor filaments on one side of the filament bundle tend to be subjected to potentially damaging amounts of tensile stress. To a degree, the twisting of the superconductor filaments within each fiber bundle helps to prevent this by rotating the position of each superconductor filament within the body of the filament bundle. Nevertheless, it has been found that prior methods for aggregating such filament bundles and packaging them into wires and cables usable in electrical machinery has proved difficult.

SUMMARY OF THE INVENTION

One object of the present invention is to produce an improved superconductor cable.

It is an additional object of the present invention to contribute to preserving the physical integrity of superconducting materials in wires and cables.

Another object of the present invention is to provide a superconductor cable that is capable of bending in the formation of electrical coils and the like, while minimizing the tensile stresses imposed on the superconductor material thereof.

Additional objects and advantages of the invention will be set forth in the description which follows, and in part will be obvious from the description, or may be learned by the practicing of the invention. The objects and advantages of the invention may be realized and obtained by means of the instruments and combinations particularly pointed out in the appended claims.

To achieve the foregoing objects, and in accordance with the invention as embodied and broadly described herein, an electric cable is disclosed which is useful in forming coils and the like. The cable comprises a superconductor, a tubular housing for the superconductor, and a flowable filler material for securing the superconductor and the housing in a fixed longitudinal relationship. The cross section of the tubular housing is such as to locate the neutral plane of bending away from the superconductor to effectively keep the superconductor under compression when the cable is bent to form the coil. The housing forms a thin-walled, elongated channel portion and has a correspondingly elongated reinforcing portion of substantial cross section. The channel portion is located on a first side of the housing and is oriented on the bend to be placed in compression when the cable is bent laterally in a predetermined direction to form the coil. The reinforcing section is located on a second side of the housing opposite from the first side with a cross section eccentric to the cross section of the housing. In this location, the reinforcing section is oriented on the bend to be placed in tension when the cable is bent.

The housing itself comprises an elongated duct or case which holds the superconductor and forms the channel portion of the housing. The duct or case has a pair of opposed sidewalls, a floor connecting corresponding ends of the sidewalls, and a laterally extending opening opposite the floor. An elongated lid of relatively substantial thickness is mounted in the opening of the duct or case by either bonding or crimping thereto. The lid substantially fills the case from the opening thereto to the neutral surface produced by lateral bending of the cable to form the coil. Preferably, the case is comprised of soft copper, while the lid is comprised of hard copper. It is to be appreciated, however, that other materials having similar characteristics and properties could be used. For example, the duct may also be made of aluminum.

The materials used in the construction of the superconductor cable of the present invention need to be selected with several considerations in mind. Specifically, these considerations include the manufacturability of the materials and their adaptability to the operating environment. More specifically, the electrical and thermal properties, as well as the relative yield strengths of the materials need to be considered. It happens that copper (Cu) has excellent electrical and thermal properties, i.e. high conductivity, and also has a relatively high Young's Modulus of elasticity. Further, copper is solderable and easily lends itself to manufacturing techniques.

As between the case and the lid, it is preferred that the lid be made of hard copper and the case be made of soft copper. This is so for several reasons. First, the U-shaped case is more easily deformed if it is made of the softer material. Thus, it is more easily formed into the duct during manufacture and more easily bent into a coil for operation. On the other hand, the harder copper of the lid permits a crimping engagement between the case and the lid during manufacture of the cable and assumes a greater portion of the bending stresses when the cable is wound into a coil. Importantly, in order to benefit from the relative strength of the lid and case when the cable is bent, the hard copper lid is located on the outside of the bend. This orientation places the lid in tension and shifts the neutral axis of the cable toward the hard copper lid which has the higher yield strength. Consequently, with the shift in the neutral axis toward the lid, more of the case or duct portion of the cable is placed into compression. As stated above, this condition is desired since the superconductor in the case is more tolerant of compressive stresses.

The present invention also contemplates a method for fabricating an elongated superconductor structure which is bendable laterally in a predetermined direction. The method comprises the steps of bending an elongated copper strip into a continuous, longitudinally extending U-shaped duct and thereafter disposing in the duct a superconductor member. A thermally and electrically conductive flowable filler is introduced into the duct to surround the superconductor member. In its operating state, the filler will be solid and will hold the superconductor member in a fixed longitudinal relationship to the duct. Thereafter the duct is closed with an elongated reinforcing member of relatively substantial cross section compared to that of the duct. Finally, the reinforcing member is secured to the duct in a fixed longitudinal relationship.

BRIEF DESCRIPTION OF THE DRAWINGS

In order that the manner in which the above-recited objects and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DESCRIPTION OF THE PREFERRED EMBODIMENTS

Figure 1:
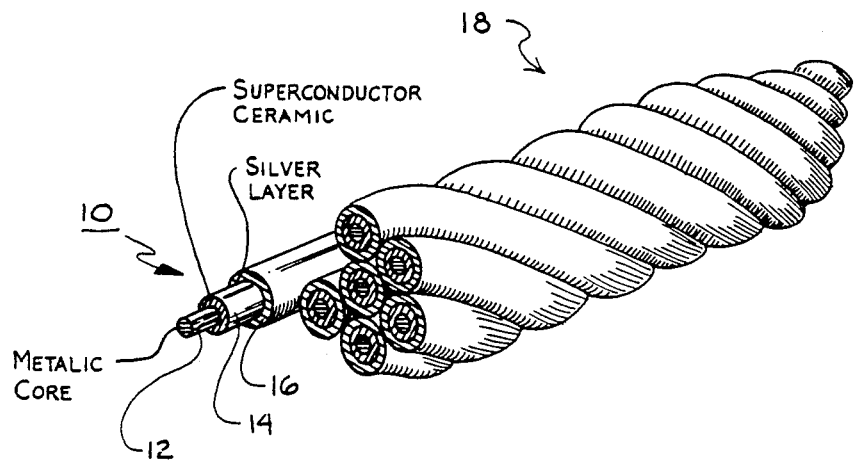
FIG. 1 is a perspective view of a typical superconductor filament bundle.

As shown in FIG. 1, a typical superconductor filament 10 is manufactured by adhering to the exterior of a fibrous metallic core 12 an encasing cylindrical layer 14 of superconductor ceramic. Core 12 provides structural support for the otherwise brittle superconductor material in cylindrical layer 14. The outer surface of core 12 is oxidized prior to or during the application of cylindrical layer 14 in order to produce a barrier for protecting the superconductor material from chemical contamination by core 12. On the exterior surface of cylindrical layer 14 a coating 16 of silver may be disposed for additional protection. A plurality of superconductor filaments 10 are typically twisted about one another to form a superconductor filament bundle 18. Although this particular superconductor configuration is considered here, it is to be appreciated that other superconductor structures may also be used with the present invention. As intended by the present invention, cable 20 shown in FIG. 2 is capable of supporting any superconductor as it is bent and wound into a coil 22.

Figure 2:
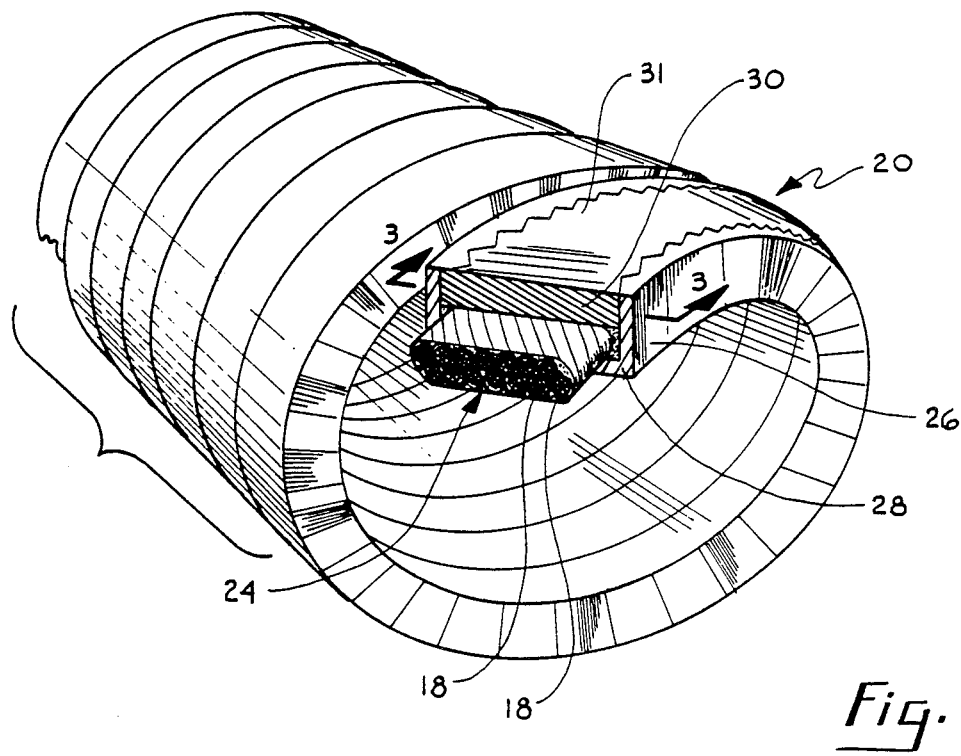
FIG. 2 is a perspective view of one embodiment of a cable incorporating the teachings of the present invention and bent to form an electromagnetic coil.

FIG. 2 illustrates one embodiment of an electric cable 20 which incorporates the teachings of the present invention to permit the bending of the cable 20 into an electric coil 22. As shown in FIG. 2, electric cable 20 comprises a superconductor member 24 and a reinforcement structure 26 which helps protect the physical integrity of the member 24 during bending in a predetermined direction. Superconductor member 24 comprises a plurality of superconductor filament bundles, such as bundles 18 shown in FIGS. 1 and 2, which are wound upon one another and bonded together into a substantially unitary structure. As with individual superconductor filaments 10 which are wound together to produce superconductor filament bundles 18, care must be exercised in winding bundles 18 into superconductor member 24 to insure that stresses are relatively evenly distributed among all of the components.

Figure 3:
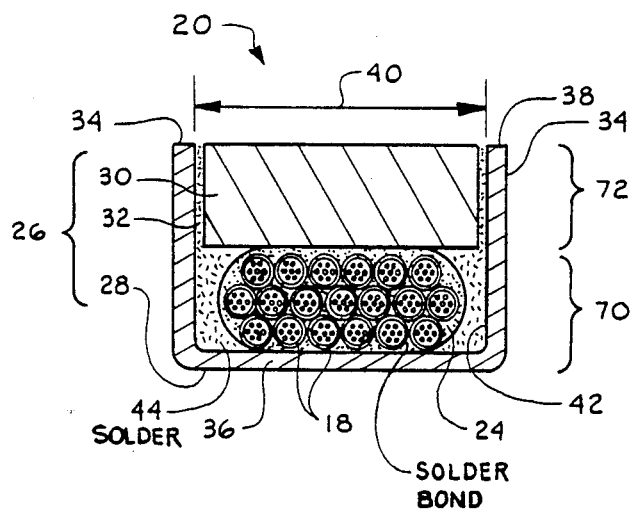
FIG. 3 is a cross-sectional end view of the cable as seen along the line 3—3 in FIG. 2.

As will be understood with additional clarity in relation to FIG. 3, electric cable 20 is manufactured by placing superconductor member 24 into the duct 28 of a reinforcement structure 26 having a cross section which is designed to locate the neutral plane of bending away from superconductor member 24 when electric cable 20 is bent in at least one predetermined direction. In accordance with the present invention, reinforcement structure 26 takes the form of a tubular housing comprising an elongated duct 28 for holding superconductor member 24, an elongated lid 30, and a bonding material 32 for securing lid 30 and duct 28 in a fixed longitudinal relationship. Duct 28 has a pair of opposed sidewalls 34 and a floor 36 connecting corresponding ends thereof. Floor 36 of duct 28 defines a predetermined direction of lateral bending for electric cable 20. When bent in this predetermined direction, reinforcement structure 26 is particularly protective of the physical integrity of superconductor materials in superconductor member 24.

A laterally extending opening 40 that provides access into duct 28 is defined between the free ends 38 of sidewalls 34 which are remote from floor 36. A lid is mounted across opening 40 to enclose superconductor member 24 within duct 28. Lid 30 possesses a relatively larger cross section when compared to that of duct 28 and is eccentrically located relative to the overall cross section of reinforcement structure 26. Correspondingly, an eccentrically located void 42 is formed within reinforcement structure 26 for housing superconductor member 24.

It is the purpose of the eccentric structure in electric cable 20 to locate the neutral plane of bending of cable 20 away from superconductor member 24 during bending in the predetermined direction defined by floor 36. In this manner, lid 30 functions as an elongated reinforcing means for resisting substantially all tensile stresses imposed upon electric cable 20 by lateral bending thereof in the predetermined direction. The side of electric cable 20 in which superconductor member 24 is disposed is thus subjected primarily to compressive stresses during bending. These are better tolerated by superconductor materials than are tensile stresses.

When required, a suitable filler material 44 is utilized to secure superconductor member 24 in a longitudinally fixed relationship within reinforcement structure 26 and a bonding material 32, such as solder, may be applied to hold lid 30 in opening 40 of duct 28. Depending on manufacturing conditions, the bonding material 32 may be the same as filler material 44.

Referring back to FIG. 2, it is seen that serrations 31 can be used to enhance the interlocking arrangement between lid 30 and case or duct 28. In this embodiment, lid 30 is formed with serrations 31 on its surfaces which interact with free ends 38 of case 28. Because lid 30 is preferably made of harder copper than that used for case 28, a crimping of free ends 38 of case 28 onto lid 30 will drive the serrations 31 into the softer copper of case 28 to hold lid 30 on case 28.

Figure 4:
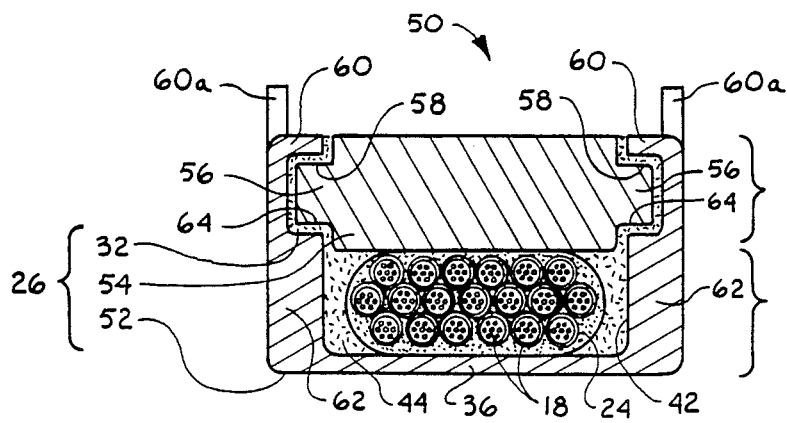
FIG. 4 is a cross-sectional end view of an alternative embodiment of a cable incorporating teachings of the present invention.

FIG. 4 illustrates an alternative embodiment of an electric cable 50 incorporating teachings of the present invention. Wherever possible, identical structure will be referred to by reference characters previously utilized. In electric cable 50, reinforcement structure 26 comprises a duct 52, a lid 54, and bonding material 32. In contrast to the device shown in FIG. 3, each side of lid 54 is provided with an elongated, over-hanging crimping ear 56 and adjacent thereto on the side of lid 54 opposite from superconductor member 24 a crimping recess 58. The sides 62 of duct 52 narrow to form a lid support shelf 64 and therebeyond free ends 60. In assembling electric cable 50, crimping ears 56 rest upon lid support shelves 64, and free ends 60 are crimped or rolled from the extended position 60a thereof shown in phantom into crimping recess 58, as shown in solid.

Thereafter, lid 54 and duct 52 may be further sealed by having bonding material 32 forced therebetween. The embodiment of the present invention, as illustrated in FIG. 4 for electric cable 50, is particularly useful in superconductor cables of substantial size, where crimping may enhance the shear strength of bonding material 32.

In both electric cable 20 shown in FIG. 3 and electric cable 50 shown in FIG. 4, reinforcement structure 26 can be appreciated as being also a tubular housing that surrounds superconductor member 24. The tubular housing comprises a thin-walled, elongated channel portion 70 for holding superconductor member 24 and a correspondingly elongated reinforcing portion 72 of substantial cross section eccentrically located in the cross section of the tubular housing. The distinct functions of channel portion 70 and reinforcing portion 72 during bending of electric cables 20 or 50 will be more easily explained in relation to FIG. 5.

Figure 5:
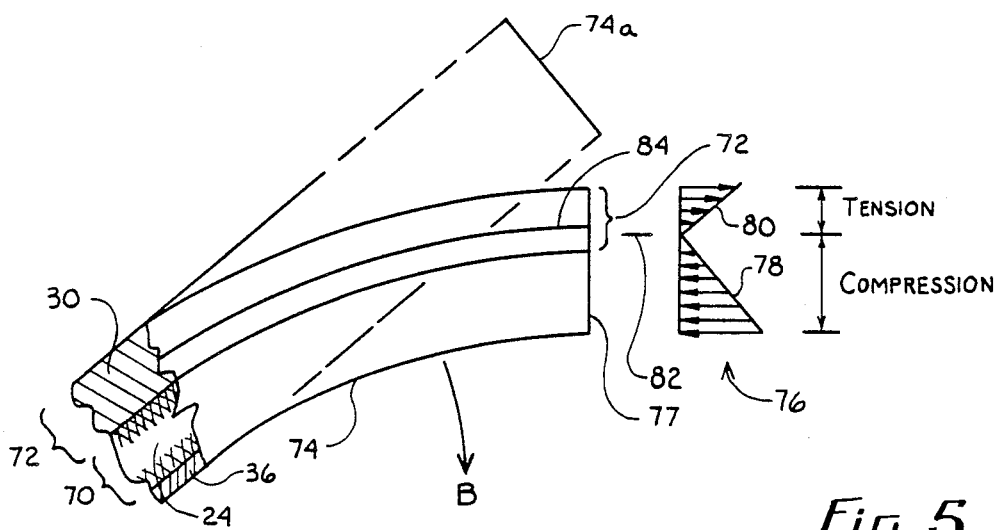
FIG. 5 is a schematic diagram illustrating the distribution of bending-induced tensile and compressive forces within a cable according to the teachings of the present invention.

A generalized electric cable 74 incorporating teachings of the present invention is shown in FIG. 5 after having been laterally bent in a predetermined direction indicated by arrow B from its original shape 74a. As illustrated, when cable 74 is bent, the channel portion 70 of generalized electric cable 74 in which the superconductor has been placed is placed in compression. In reaction to this compression, at least part of reinforcing portion 72 thereof is placed in tension.

This condition is depicted graphically in the stress diagram 76 located immediately to the right of the free end 77 of generalized electric cable 74. In diagram 76, lower triangle 78 with its vector arrows directed toward channel portion 70 of electric cable 74 indicates the imposition of compressive stresses at the corresponding portions of the cross section of generalized electric cable 74. Upper triangle 80 having its vector arrows pointing away from reinforcing portion 72 of generalized electric cable 74 indicates that corresponding portions of the cross section thereof are subjected to tensile stresses. The amount of stress, both compressive and tensile, varies in a generally linear manner from the point of no stress on the neutral axis 82. In diagram 76, neutral axis 82 lies between lower triangle 78 and upper triangle 80.

Actually, neutral axis 82 in stress diagram 76 corresponds to a so-called neutral plane 84 which is the location in cable 74 where there is a change between the compressive and tensile stresses developed in generalized electric cable 74 when it is bent in the predetermined direction indicated by arrow B. Neutral surface 84 may, but will not necessarily, correspond to the boundary between channel portion 70 and reinforcing portion 72 of generalized electric cable 74. With proper selection of the size of the cross section of lid 30, as well as of the Young's modulus of elasticity of the material of which lid 30 and the other elements of generalized electric cable 74 are comprised, the location of neutral plane 84 in cable 74 may be varied. In any event, neutral plane 84 is preferably located in lid 30. As a result, superconductor member 24 resting against floor 36 in channel portion 70 will be subjected exclusively to compressive forces, which are relatively well tolerated by the superconductor ceramic in the superconductor filaments of superconductor member 24. Correspondingly, tensile stresses, such as those illustrated by upper triangle 80 in stress diagram 76, are borne most by relatively massive lid 30, which may advantageously be fabricated from a hard material. In this manner, the physical integrity of the superconductor ceramic is sustainable, even during bending of the cable in which it is incorporated.

While it is optimally desirable to be able to subject superconductor ceramic material to compressive stresses exclusively, small tensile stresses may be tolerable. These are, for example, necessarily imposed in the process of winding superconductor filaments 10 into superconductor filament bundle 18 or in fabricating superconductor member 24 from a plurality of superconductor filament bundles 18. Nevertheless, tensile stresses should be minimized. Where the areas of tensile stress imposed upon superconductor member 24 are relatively minimal, the physical integrity of the superconductor material involved is well protected.

Thus, in summary, an electrical cable is provided having structure that performs three significant functions. First, the cable comprises a superconductor means, such as superconductor member 24, for conducting electricity in a substantially resistance-free manner in a longitudinal direction along the cable. Disposed adjacent to the superconductor means is an elongated reinforcing means for resisting substantially all tensile stresses imposed on the cable by lateral bending thereof in a predetermined direction defined by the side of the cable in which the superconductor means is disposed. Such reinforcing means can take the form of lid 30 shown in FIG. 3 or lid 54 shown in FIG. 4. In addition, the electric cable of the present invention comprises an enclosure means for encircling the superconductor means and for securing the reinforcing means thereto in a longitudinally fixed relationship. By way of example and not limitation, in FIG. 3, a channel means comprising duct 28 is provided for holding the superconductor means. The channel means is secured to the reinforcing means either by a bonding material 32 alone, or in addition or in the alternative, by crimping as illustrated in the case of free ends 38 of side wall of duct 28 in FIG. 3.

It is the purpose of the reinforcing means, e.g. lid 30, of the present invention, to shift the neutral plane of bending away from the superconductor means. Thus, when the electric cable is bent, the superconductor means will be substantially in compression.

Figure 6:
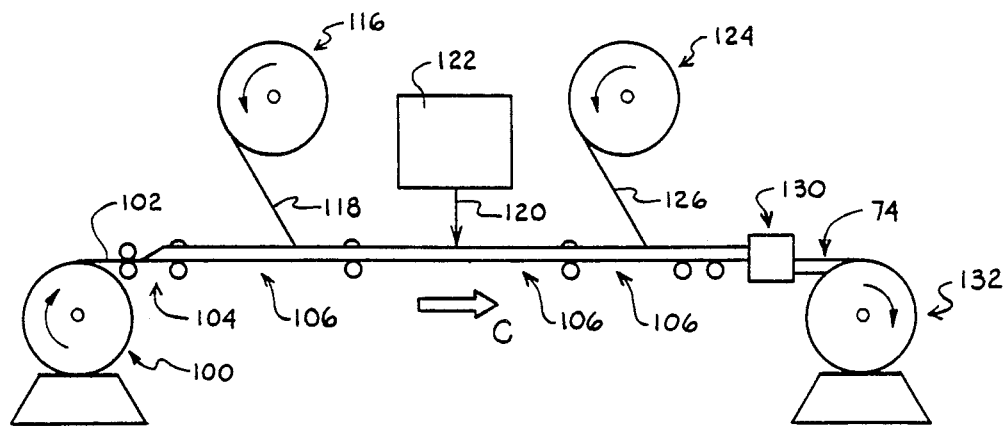
FIG. 6 is a schematic diagram illustrating a method for manufacturing an electric cable according to the teachings of the present invention.

The present invention also contemplates a method for producing the superconductor cables described above. Such a method is illustrated schematically in FIG. 6 and correspondingly by successive cross-sectional views of the cable in its various steps of fabrication. As shown in FIG. 6, an assembly line series of processes for fabricating generalized electric cable 74 are shown in which the materials involved move from left to right in a direction indicated by arrow C. A roller 100 feeds an elongated thin copper strip 102 shown in cross section in step A of FIG. 7 into a series of forming rollers 104. As strip 102 passes through rollers 104, the copper strip 102 is bent into a continuous, longitudinally extending U-shaped duct 106 shown in cross section in step B of FIG. 7. Duct 106 has a floor 108, two parallel sidewalls 110 extending therefrom, and an opening 112 between the free ends 114 of sidewalls 110.

Figure 7:
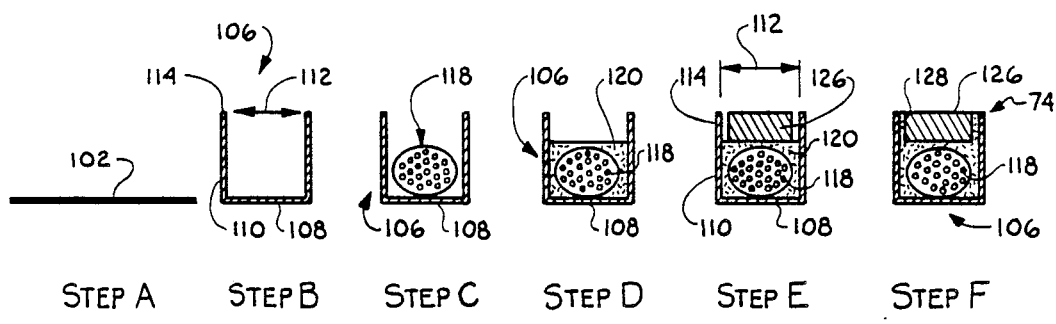
FIG. 7 is a sequence of cross-sectional end views of the cable in FIG. 2 during the process of the manufacture according to the method illustrated in FIG. 6.

From a second roller 116, a superconductor member 118 is disposed in duct 106 adjacent to floor 108 thereof as shown in step C of FIG. 7. Thereafter, a flowable filler 120 is introduced from a filler source 122 into duct 106 to surround superconductor member 118 in the portion of duct 106 adjacent to floor 108 thereof. A cross section of the evolving cable in this state of manufacture appears at step D in FIG. 7. Flowable filler 120 serves to stabilize superconductor member 118 in a fixed longitudinal relationship to duct 106.

A third roller 124 feeds an elongated reinforcing member 126 of relatively substantial cross section into opening 112 of duct 106, where reinforcing member 126 rests upon filler 120 and superconductor member 118 as shown in step E of FIG. 7. Reinforcing member 126 thus functions as a lid for closing duct 106. Thereafter, reinforcing member 126 is secured to duct 106 either by crimping of walls 110 thereagainst, or as shown in step F of FIG. 7, by the injection between reinforcing member 126 and walls 110 of a bonding material 128, such as solder, at a soldering station 130. Thereafter, the completed electric cable 74 can be wound onto a fourth roller 132.

It is considered that the present invention has utility not merely with superconductor materials, but with any type of conductor sensitive to tensile stresses. It is further understood that the principles of the present invention disclosed herein are useful for protecting conductor materials which, unlike currently known superconductor materials, are sensitive to compression. Compression-sensitive conductors could be protected in bending by reversing the relative position of the conductor and the reinforcing means in the above-described embodiments of the invention in relation to the predetermined direction of lateral bending therefor. Under such circumstances, the reinforcing member or lid for the duct in which the conductor is placed would define the direction of lateral bending, so that the neutral plane during bending, by falling between the reinforcing member and the conductor, would result in tensile stresses exclusively being applied to the reinforcing member, rather than to the compression-sensitive conductor.

While the particular superconductor cable as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

I claim:

1. A reinforcement for superconductor filaments subjected to lateral bending in a predetermined direction, said reinforcement comprising:

(a) an elongated, rectangular duct made of soft copper, having a pair of opposed sidewalls and a floor connecting corresponding ends of said sidewalls for holding the superconductor filaments, said sidewalls establishing a laterally extending opening therebetween and opposite said floor; and (b) an elongated, rectangular lid made of hard copper and mounted across said opening and attached to said sidewalls of said duct to hold the superconductor filaments therein, said lid having sufficient thickness to locate the neutral surface of said reinforcement to substantially subject the superconductor filaments to compression during lateral bending of said reinforcement in a predetermined direction.

2. A reinforcement for superconductor filaments as recited in claim 1, wherein said duct has a U-shaped cross section.

3. A reinforcement for superconductor filaments as recited in claim 1, further comprising:

(a) an electrically and thermally conductive flowable filler for surrounding said superconductor filaments in said duct and stabilizing said superconductor filaments in a fixed longitudinal relationship thereto; and
(b) a sealant for securing said lid to said duct in a fixed longitudinal relationship.

4. An electric cable for use in forming a coil, said cable comprising:
(a) superconductor;
(b) a tubular housing for said superconductor for locating the netural plane of bending away from said superconductor when the cable is bent to form a coil, said housing having a thin-walled, elongated channel portion for holding said superconductor and a corresponding elongated reinforcing portion of substantial cross section, said channel portion having a pair of opposed sidewalls and a floor on said first side of said housing connecting corresponding ends of said sidewalls, and being located on a first side of said housing placed in compression when the cable is bent laterally in a predetermined direction to form a coil, and said reinforcing portion being located on a second side of said housing opposite from said first side and secured to said channel portion by crimping the free ends of the sidewalls of said channel portion to said reinforcing portion, and bonding said reinforcing portion to said channel portion with solder; and
(c) a flowable filler material for securing said superconductor and said housing in a fixed longitudinal relationship.

5. An electric cable as recited in claim 4, wherein said hosing has a generally rectangular cross section and is formed with an eccentrically located void for holding said superconductor therein.

6. An electric cable as recited in claim 4, wherein said duct is comprised of soft copper, and said lid is comprised of hard copper.

7. An electric cable comprising:
(a) superconductor means for conducting electricity in a substantially resistance-free manner in a longitudinal direction along said cable;
(b) channel means for holding said superconductor means; and
(c) elongated reinforcing means disposed adjacent said superconductor means, said reinforcing means being secured to said channel means to hold said superconductor means therein, said reinforcing means having a yield strength sufficiently greater than the yield strength of said channel means for enabling said reinforcing means to resist substantially all tensile stresses imposed on the cable by lateral being thereof in a predetermined direction having a radius of curvature on the side of said cable in which said superconductor means is disposed.

8. An electric cable as recited in claim 7, wherein said enclosure means comprises:
(a) channel means for holding said superconductor means, said reinforcing means being secured to said channel means to hold said superconductor means therein;
(b) stabilizing means for securing said superconductor means and said channel means in a fixed longitudinal relationship; and
(c) sealant means for securing said reinforcing means to said channel means.

9. An electric cable as recited in claim 8, wherein said channel means comprises an elongated U-shaped duct.

10. An electric cable as recited in claim 8, wherein said channel means has a generally rectangular cross section.

11. An electric cable as recited in claim 8, wherein said channel means is comprised of soft copper.

12. An electric cable as recited in claim 8, wherein said stabilizing means comprises an electrically and thermally conductive flowable filler injected into said channel means to surround said superconductor means and bond said superconductor means to said cable in a relatively fixed longitudinal relationship.

13. An electric cable as recited in claim 8, wherein said sealant means comprises a continuous interface of solder between said reinforcing means and said channel means.

14. An electric cable as recited in claim 7, wherein said reinforcing means has a substantially rectangular cross section.

15. An electric cable as recited in claim 7, wherein said reinforcing means is comprised of hard copper and said enclosure means is comprised of relatively soft copper, said reinforcing means being formed with serrations which become embedded when said enclosure means is crimped onto said reinforcing means to hold said enclosure means on said reinforcing means.

16. An electric cable as recited in claim 7, wherein the neutral plane created when said electric cable is bent laterally in said predetermined direction is shifted by said reinforcing means away from said superconductor means.

17. A composite superconductor structure bendable laterally in a predetermined direction, said superconductor structure comprising:
(a) a U-shaped sheath having an opening thereinto extending the length of said sheath and opposite thereto a floor defining the predetermined direction for lateral bending;
(b) a superconductor member disposed in said sheath adjacent said floor thereof; and
(c) a reinforcing member secured in said opening to said sheath to seal said superconductor member therein, said reinforcing member having a higher yield strength than said sheath, and so comprised and configured relative to said sheath to bear substantially all tensile stresses imposed on said composite superconductor structure when said structure bends in said predetermined direction.

18. A composite superconductor structure as recited in claim 17 further comprising a filler for stabilizing said superconductor member in said sheath in a longitudinally fixed relationship.

19. A composite superconductor structure as recited in claim 17 further comprising a sealant for closing said sheath and retaining said reinforcing member in said opening thereof.

20. A composite superconductor structure as recited in claim 17, wherein said sheath and said reinforcing member secured thereto have a generally rectangular cross section with an eccentrically located void therein for holding the superconductor structure.

21. A composite superconductor structure as recited in claim 17, wherein a neutral plane with no bending forces is located at the edge of said reinforcing member adjacent said superconductor structure when said composite superconductor structure is bent laterally in the predetermined direction.

22. A composite superconductor structure as recited in claim 17, wherein a neutral plane with no bending forces intersects said reinforcing member when said composite superconductor structure is bent laterally in the predetermined direction.

23. A composite superconductor structure as recited in claim 17, wherein said sheath and said reinforcing member are comprised of copper.

24. A composite superconductor structure as recited in claim 23, wherein said copper of said sheath is soft copper and said copper of said reinforcing member is hard copper.

25. A method for fabricating an elongated superconductor structure bendable laterally in a predetermined direction, said method comprising the steps of:
 (a) bending an elongated copper strip into a continuous longitudinally extending U-shaped duct;
 (b) disposing in said duct a superconductor member;
 (c) introducing into said duct a flowable filler to surround said superconductor member and stabilize said superconductor member in a fixed longitudinal relationship to said duct;
 (d) closing said duct with an elongated reinforcing member of relatively substantially cross section compared to that of said duct; and
 (e) securing said reinforcing member to said duct in a fixed longitudinal relationship by crimping, to fix said reinforcement member to said duct.

26. A method for fabricating an elongated superconductor structure as recited in claim 25, wherein said duct is comprised of soft copper.

27. A method for fabricating an elongated superconductor structure as recited in claim 25, wherein said reinforcing member is comprised of hard copper.

28. A method for fabric an elongated superconductor structure as recited in claim 25, wherein said step of securing employs solder to fix said duct to said reinforcing member.

29. A method for fabric an elongated superconductor structure as recited in claim 25 wherein said step to securing employs crimping and solder to fix said duct to said reinforcing member.

* * * * *